(12) United States Patent
Kikkawa

(10) Patent No.: US 6,501,105 B2
(45) Date of Patent: Dec. 31, 2002

(54) COMPOUND SEMICONDUCTOR DEVICE

(75) Inventor: Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/818,646

(22) Filed: Mar. 28, 2001

(65) Prior Publication Data

US 2002/0050604 A1 May 2, 2002

(30) Foreign Application Priority Data

Sep. 8, 2000 (JP) ......................................... 2000-273483

(51) Int. Cl.⁷ ........................................... H01L 31/0328
(52) U.S. Cl. ........................ 257/192; 257/194; 257/200; 438/167; 438/172; 438/285
(58) Field of Search .............. 257/20, 24, 27, 257/192, 194, 189, 200, 201, 280; 438/285, 590, 172, 167

(56) References Cited

U.S. PATENT DOCUMENTS 5,504,353 A * 4/1996 Kuzuhara .................... 257/194
5,767,539 A * 6/1998 Onda ......................... 257/194
5,945,695 A * 8/1999 Takikawa .................... 257/192
6,232,624 B1 * 5/2001 Matloubian et al. ........ 257/194

FOREIGN PATENT DOCUMENTS

JP 6-236898 8/1994
JP 7-335867 12/1995

OTHER PUBLICATIONS

J.K. Shurtleff et al. U.S.A. Band–gap control of GaInP using Sb as a surfactant Applied Physics Letters vol. 75, No. 13, Sep. 27, 1999, pp. 1914–1916.

* cited by examiner

*Primary Examiner*—Steven Loke
*Assistant Examiner*—Donghee Kang
(74) *Attorney, Agent, or Firm*—Armstrong, Westerman & Hattori, LLP

(57) ABSTRACT

There is provided a compound semiconductor device having a MESFET whic comprises a channel layer made of $In_xGa_{1-x}P_ySb_{1-y}$ (where $0.3<x<0.7$, $0.9<y<0.999999$) formed by doping an impurity onto a substrate, a barrier layer formed on the channel layer, a gate layer formed on the barrier layer, and a source electrode and a drain electrode formed separately on both sides of the gate electrode on the barrier layer. Accordingly, the mutual conductance of the compound semiconductor device having the MESFET can be increased rather than the prior art.

11 Claims, 3 Drawing Sheets

COMPOUND SEMICONDUCTOR DEVICE

BACKGROUND OF THE INVENTION

1. Field of the Invention

The present invention relates to a compound semiconductor device and, more particularly, a compound semiconductor device having a MESFET (Metal-Semiconductor FET).

2. Description of the Prior Art

In the power amplifier for the cellular phone base station, requests for the increase of the power supply voltage and the improvement of the power characteristic are increased in recent years, and thus the higher breakdown voltage is indispensable for the transistor employed in the power amplifier.

However, the MESFET having the GaAs channel layer is difficult to adapt to the increase of the power supply voltage since the GaAs channel layer is ready to be destroyed because of the electric field concentration, such MESFET is unsuitable for the power amplifier.

Therefore, the higher breakdown voltage of the MESFET is required.

In order to improve the breakdown voltage of the MESFET, as shown in FIG. 1, there is a structure in which the GaAs channel layer is replaced with the InGaP channel layer.

In FIG. 1, a buffer layer 102 made of AlGaAs is formed on a semiinsulating GaAs substrate 101, and then a channel layer 103 made of n-type $In_{0.52}Ga_{0.48}P$ and a barrier layer 104 made of undoped AlGaAs are formed in sequence on the buffer layer 102.

Also, a contact layer 105 made of undoped GaAs is formed on the barrier layer 104. An opening 105a for exposing the barrier layer 104 is formed in the contact layer 105, and a gate electrode 106 is connected to the barrier layer 104 via the opening 105a. The gate electrode 106 and the barrier layer 104 are connected to each other to form Schottky junction.

In addition, a source electrode 107 and a drain electrode 108 are connected to the contact layer 105 on both sides of the gate electrode 106. The n-type impurity is ion-implanted at a high concentration into the contact layer 105 located under the source electrode 107 and the drain electrode 108. Accordingly, the source electrode 107 and the drain electrode 108 come into contact with the cap layer 105 to form ohmic-contact respectively.

The breakdown voltage of the above-mentioned MESFET having the InGaP channel layer is about 2 to 3 times higher than that of the MESFET having the GaAs channel layer.

As described above, since the MESFET whose channel layer is formed of InGaP has the high breakdown voltage rather than the prior art but the mobility in the channel layer 103 is low, the resistance is high and the mutual conductance ($g_m$) is low. As a result, the gain is lowered rather than the prior art, and thus it is impossible to reap effectively the advantage such as the improvement of the breakdown voltage.

SUMMARY OF THE INVENTION

It is an object of the present invention to provide a compound semiconductor device having a transistor whose gain can be increased rather than the prior art.

The above subject can be overcome by forming the channel layer of the MESFET by InGaPSb.

Since the MESFET having the channel layer formed of InGaPSb make it possible to reduce the sheet resistance by using the small threshold voltage rather than the MESFET in the prior art, the mutual conductance and the gain of the MESFET can be increased without the reduction in the breakdown voltage.

DESCRIPTION OF THE PREFERRED EMBODIMENT

An embodiment of the present invention will be explained with reference to the accompanying drawings hereinafter.

Figure 2:
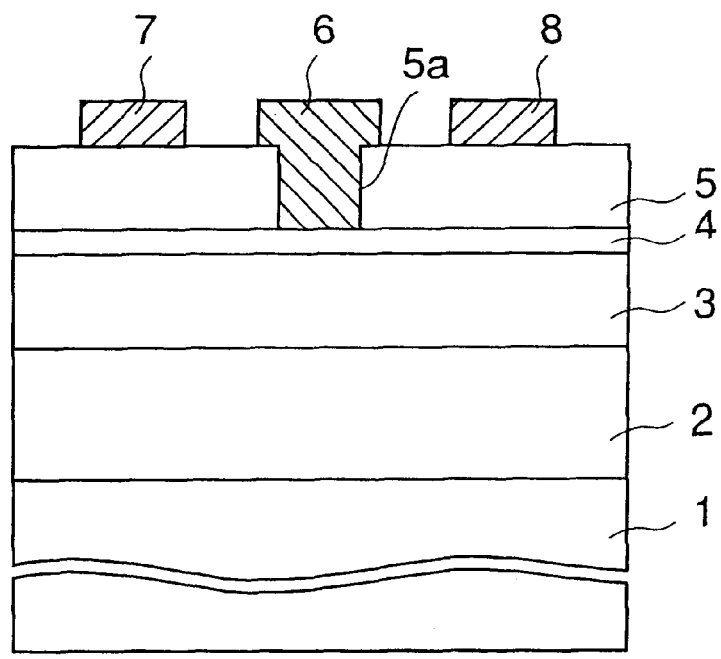
FIG. 2 is a sectional view showing a MESFET according to an embodiment of the present invention.

FIG. 2 is a sectional view showing a MESFET according to an embodiment of the present invention.

In FIG. 2, a buffer layer 2 made of undoped $Al_{0.3}Ga_{0.7}As$ is formed on a semiinsulating GaAs substrate 1 to have a thickness of 300 nm, for example. Then, a channel layer 3 made of n-type $In_xGa_{1-x}P_ySb_{1-y}$ (where $0.3<x<0.7$, $0.9<y<0.999999$) is formed on the buffer layer 2 to have a thickness of 150 nm, for example. Silicon having a concentration of $1.5\times10^{17}$ cm$^{-3}$ is contained in this channel layer 3.

A Schottky barrier layer 4 made of undoped $Al_{0.3}Ga_{0.7}As$ is formed on the channel layer 3 to have a thickness of 20 nm, for example. In addition, a contact layer 5 made of undoped GaAs or n-type GaAs is formed on the Schottky barrier layer 4. An opening 5a for exposing the Schottky barrier layer 4 is formed in the contact layer 5, and a gate electrode 6 is connected to the Schottky barrier layer 4 via the opening 5a. The gate electrode 6 and the Schottky barrier layer 4 are connected to form the Schottky junction. The gate electrode 6 is formed of a tungsten film, a tungsten silicide film, an aluminum film, or the like.

Further, ohmic-contact regions are formed on both sides of the gate electrode 6 by ion-implanting the silidon into the contact layer 5, and a source electrode 7 and a drain electrode 8 are connected thereto via the ohmic-junction respectively. The source electrode 7 and the drain electrode 8 are formed of a metal film, for example.

Above respective layers from the buffer layer 2 to the contact layer 5 are formed by the MOCVD method, for example. Then, followings are employed as respective source gases of gallium (Ga), indium (In), aluminum (Al), antimony (Sb) in the group III elements, and arsenic (As), phosphorus (P) in the group V elements, for example.

For example, there is trimethylgallium (TMGa) or triethylgallium (TEGa) as the source gas for gallium, there is trimethylaluminium (TMAl) as the source gas for aluminium, there is trimethylindium (TMIn) as the source gas for indium, and there is trimethylantimony (TMSb) as the source gas for antimony. Also, there is arsine ($AsH_3$) as the source gas for arsenic, and there is phosphine ($PH_3$) as the source gas for phosphorus. In addition, disilane ($Si_2H_6$) is employed as the n-type dopant gas.

The low pressure lateral CVD furnace is employed as the growing furnace for growing respective group III–V semiconductor layers 2 to 5. Then, in order to form the group III–V semiconductor layers 2 to 5 by using the low pressure lateral CVD furnace, the growing temperature is set to 600 to 750° C., for example, and the pressure is adjusted to about 76 Torr by reducing the pressure of the growth atmosphere.

In this case, the GaAs substrate 1 has a surface that is deviated from (100) by 2 degree, and the buffer layer 2, etc. are formed on the surface.

Figure 3:
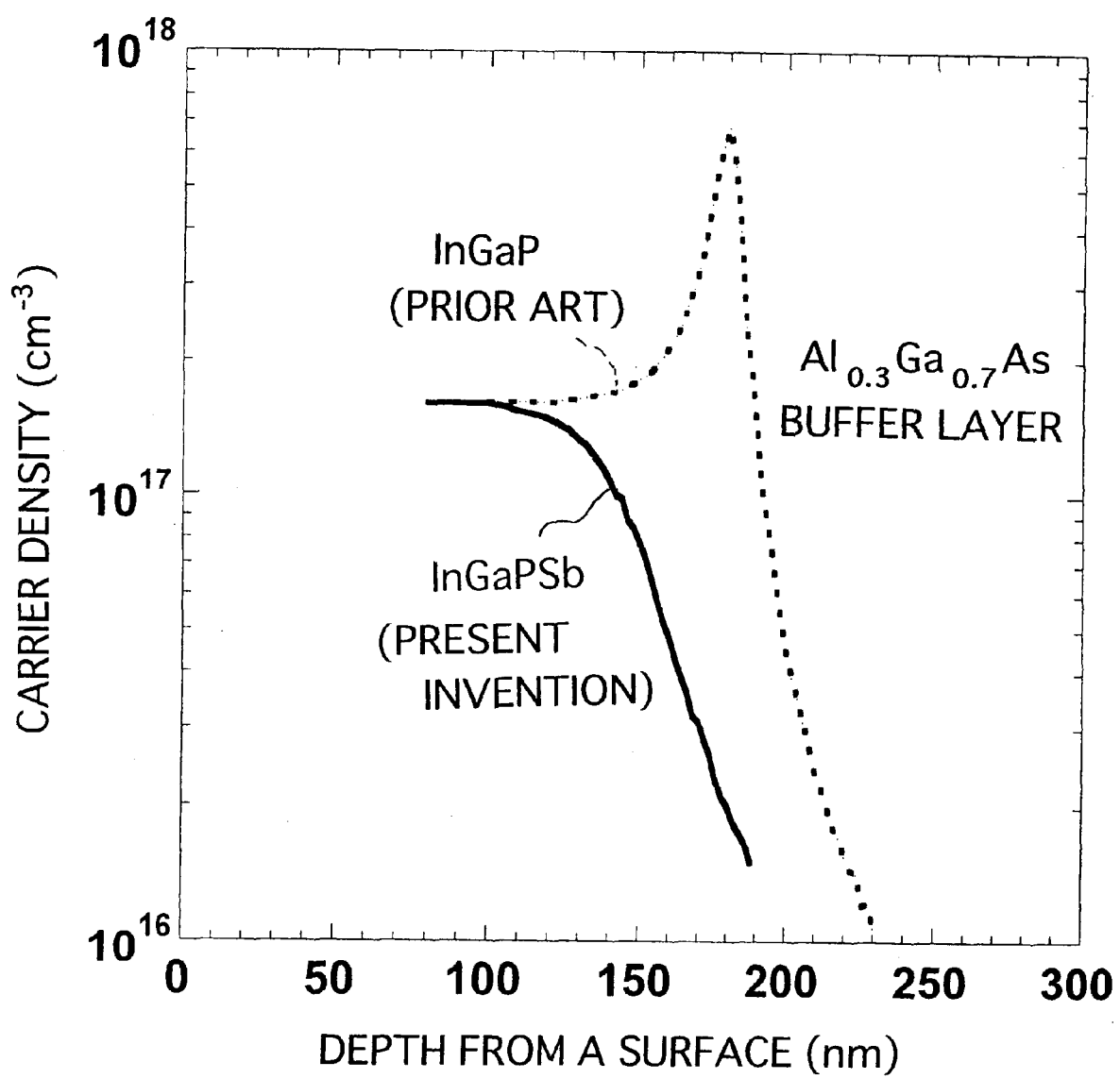
FIG. 3 is a graph showing carrier density profiles in respective channel layers of the MESFET according to the embodiment of the present invention and the MESFET in the prior art.

Then, after respective layers up to the InGaPSb channel layer 3 are grown on the GaAs substrate 1 in the structure of the MESFET according to the present embodiment shown in FIG. 2, when a carrier density profile of the channel layer 3 is evaluated, the result indicated by a solid line in FIG. 3 is obtained. Composition ratios x, y of $In_xGa_{1-x}P_ySb_{1-y}$ constituting the channel layer 3 employed in this experiment are x=0.52, y=0.999999 respectively. The carrier density profile of the InGaPSb channel layer 3 in FIG. 3 is depicted while comparing with the carrier density profile of the InGaP channel layer indicated by a broken line in the prior art. In the case of the InGaP channel layer 103 in the prior art, the storage of the carriers appears on the interface between the channel layer and the $Al_{0.3}Ga_{0.7}As$ buffer layer. In contrast, in the case of the InGaPSb channel layer 3, no storage of the carriers appears.

Difference between these carrier density profiles appears as difference between threshold voltages Vth of the resultant devices. The threshold voltage Vth was—2.5 V when InGaPSb is used as the channel layer, while and the threshold voltage Vth was deep such as –5.7 V when InGaP is used as the channel layer.

Figure 1:
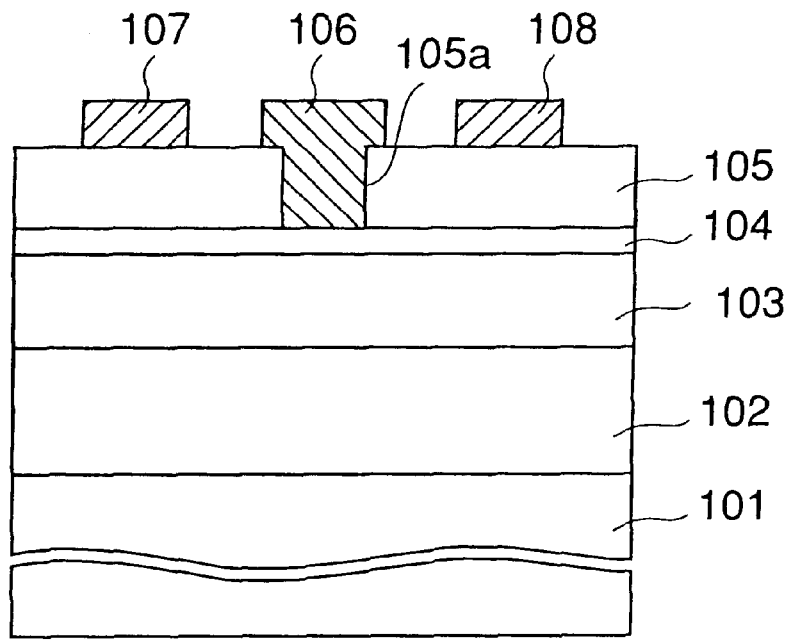
FIG. 1 is a sectional view showing a MESFET in the prior art.
Figure 4:
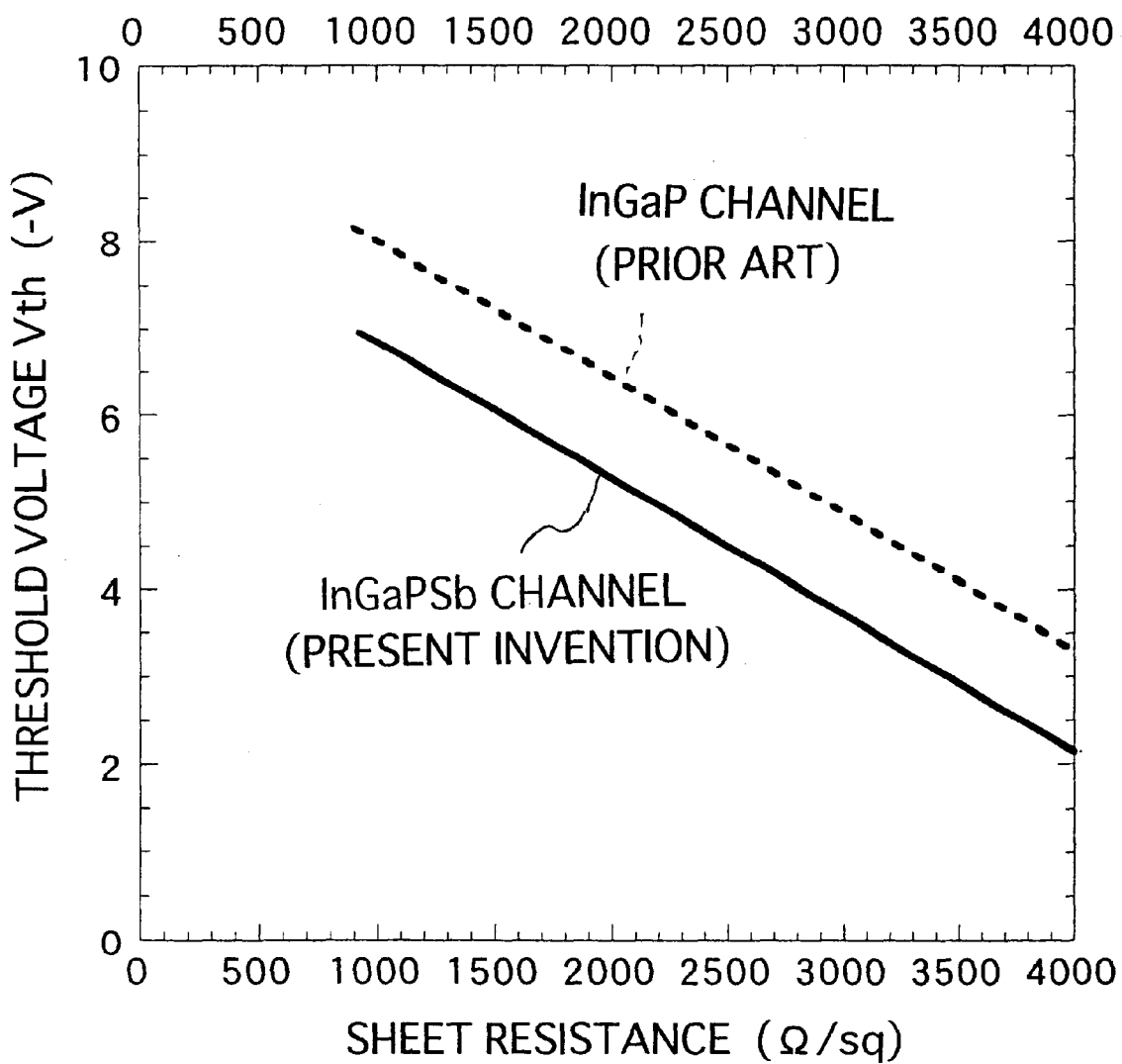
FIG. 4 is a graph showing relationships between the sheet resistance and the threshold voltage (Vth) in the MESFET according to the embodiment of the present invention and the MESFET in the prior art.

FIG. 4 shows relationships between the sheet resistance and the device threshold voltage in the structures shown in FIG. 1 and FIG. 2. Under the same sheet resistance, the threshold voltage of the InGaPSb channel layer 3 is shallower by 1 V than the InGaP channel layer 103. As a result, in the MESFET having the same current driving capability, the mutual conductance $g_m$ is different. Differences of these mutual conductances $g_m$ are given in Table 1.

TABLE 1

Comparison of MESFET characteristics (gate length 1.0 μm)

|  | InGaPSb channel | InGaP channel |
|---|---|---|
| mutual conductance $g_m$ (mS/mm) | 70 mS/mm | 50 mS/mm |
| gate-drain inverse breakdown voltage Vdgo (V) | 55 V | 55 V |

According to Table 1, if the InGaPSb channel layer 3 is employed, the mutual conductance $g_m$ can be improved by 40% in contrast to the InGaP channel layer 103, while maintaining the same breakdown voltage.

In this case, in the above embodiment of the present invention, the source electrode 7 and the drain electrode 8 may be formed on the barrier layer 4 without formation of the contact layer 5 on the barrier layer 4. Also, in the above embodiment of the present invention, the silicon is employed as the n-type impurity, but selenium (Se) may be employed.

As described above, according to the present invention, since the channel layer of the MESFET is formed of InGaPSb, the mutual conductance can be increased higher than the prior art.

What is claimed is:

1. A compound semiconductor device having a MESFET, the MESFET comprising:

a channel layer made of $In_xGa_{1-x}P_ySb_{1-y}$ where 0.3<x<0.7, 0.9<y<0.999999, formed by doping an impurity onto a substrate;

a barrier layer formed on the channel layer;

a gate layer formed on the barrier layer; and a source electrode and a drain electrode formed separately on both sides of the gate electrode on the barrier layer.

2. A compound semiconductor device according to claim 1, wherein the substrate is a GaAs substrate.

3. A compound semiconductor device according to any one of claim 1 and claim 2, further comprising a buffer layer made of AlGaAs and formed between the substrate and the channel layer.

4. A compound semiconductor device according to claim 1, wherein the barrier layer is an undoped AlGaAs layer.

5. A compound semiconductor device according to claim 4, wherein composition of Ga is larger in quantity than composition of Al in the AlGaAs layer.

6. A compound semiconductor device according to claim 1, further comprising a contact layer formed between the source electrode and the barrier layer and between the drain electrode and the barrier layer respectively.

7. A compound semiconductor device according to claim 6, wherein the contact layer is formed of GaAs into which the impurity is doped.

8. A compound semiconductor device according to claim 7, wherein the impurity is either silicon or selenium.

9. A compound semiconductor device according to claim 1, wherein the impurity is either silicon or selenium.

10. A compound semiconductor device having a MESFET, the MESFET comprising:

a substrate;

a buffer layer formed on the substrate;

a channel layer made of $In_xGa_{1-x}P_ySb_{1-y}$ wherein 0.3<x<0.7, 0.9<y<0.999999, formed by doping an impurity on the buffer layer, the channel layer for improving a local accumulation of a carrier in an interface between the channel layer and the buffer layer;

a barrier layer formed on the channel layer;

a gate layer formed on the barrier layer; and a source electrode and a drain electrode formed separately on both sides of the gate electrode on the barrier layer.

11. A compound semiconductor device according to claim 1, wherein x in the $In_xGa_{1-x}P_ySb_{1-y}$ is 0.52, and y in the $In_xGa_{1-x}P_ySb_{1-y}$ is 0.999999.

* * * * *